United States Patent
Koike (10) Patent No.: US 8,816,413 B2
(45) Date of Patent: Aug. 26, 2014

(54) SEMICONDUCTOR IMAGING DEVICE WITH WHICH SEMICONDUCTOR ELEMENTS OF PIXEL AREA AND OTHER AREAS HAS SAME CHARACTERISTICS

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 754 days.

(21) Appl. No.: 12/725,511

(22) Filed: Mar. 17, 2010

(65) Prior Publication Data

US 2010/0301444 A1 Dec. 2, 2010

(30) Foreign Application Priority Data

May 28, 2009 (JP) ................. 2009-129262

(51) Int. Cl.
*H01L 31/10* (2006.01)
*H01L 31/112* (2006.01)

(52) U.S. Cl.
USPC .......................................... 257/292; 257/432

(58) Field of Classification Search
USPC .............. 257/E31.113, E21.533, 292–294, 257/431–443; 438/73
See application file for complete search history.

(56) References Cited

U.S. PATENT DOCUMENTS

| 2004/0174439 A1* | 9/2004 | Upton ..................... 348/222.1 |
| 2006/0060899 A1* | 3/2006 | Hong et al. .................. 257/294 |
| 2007/0232074 A1* | 10/2007 | Ravi et al. .................. 438/758 |
| 2008/0283893 A1* | 11/2008 | Shih et al. ................... 257/314 |

FOREIGN PATENT DOCUMENTS

| JP | 2003-324189 | 11/2003 |
| JP | 2004-311902 | 11/2004 |
| JP | 2008-199059 | 8/2008 |
| JP | 2009-99626 | 5/2009 |

OTHER PUBLICATIONS

U.S. Appl. No. 12/971,478, filed Dec. 17, 2010, Koike.
Japanese Office Action issued Mar. 19, 2013, in Japan Patent Application No. 2009-129262 (with English translation).

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

Photoelectric conversion elements are arranged in a pixel area. A circuit area is arranged around the pixel area. An interconnect including copper is arranged in the pixel area and circuit area. A cap layer is arranged on the interconnect. Wherein the cap layer except a part on the interconnect is removed from the pixel area and circuit area.

14 Claims, 6 Drawing Sheets

SEMICONDUCTOR IMAGING DEVICE WITH WHICH SEMICONDUCTOR ELEMENTS OF PIXEL AREA AND OTHER AREAS HAS SAME CHARACTERISTICS

CROSS-REFERENCE TO RELATED APPLICATIONS

This application is based upon and claims the benefit of priority from prior Japanese Patent Application No. 2009-129262, filed May 28, 2009, the entire contents of which are incorporated herein by reference.

BACKGROUND OF THE INVENTION

1. Field of the Invention

The present invention relates to a semiconductor imaging device such as a CMOS sensor image.

2. Description of the Related Art

A semiconductor imaging device, especially a CMOS sensor, has been miniaturized in recent years, and generally uses copper (Cu) for interconnects with a pitch of 1.4 μm or smaller. In an imaging device using Cu interconnects, a cap layer composed of a $Si_3N_4$ film is formed on a Cu interconnect to prevent diffusion and oxidation of Cu. A SiN cap layer reduces light transmissivity. Therefore, a CiN cap layer on an optical path is removed from a pixel area.

A pixel area is surrounded by a dummy pixel area having substantially the same configuration as a pixel area, a black reference area for generating a black reference signal, an analog signal processing area, and a logic circuit area as a digital signal processing area. These areas are not exposed to light, and a Cu interconnect is present on a pixel. Therefore, a SiN cap layer is not removed (refer to Jpn. Pat. Appln. KOKAI Publication No. 2008-199059).

Semiconductor processing includes heat treatment so-called sintering, in which a dangling bond generated in a gate oxide film as a non-coupling means is terminated by hydrogen. However, as a SiN cap layer hardly transmits hydrogen, the amount of hydrogen applied to a substrate during sintering is different in a pixel area not having a SiN cap layer, a dummy pixel area having a SiN cap layer, a black reference area, and a logic circuit area. In other words, the amount of hydrogen is smaller in a dummy pixel area, black reference area, and logic circuit area than that in a pixel area, and the dangling bond is not sufficiently terminated in some locations in these areas. Thus, a transistor leakage current increases in a dummy pixel area, black reference area, and logic circuit area. Especially, at a dark period, the characteristic of a pixel area becomes different from those of a dummy pixel area, black reference area, analog signal processing area, and logic circuit area. Therefore, a semiconductor imaging device, in which semiconductor elements in a pixel area and other areas can be set to the same characteristics, is demanded.

BRIEF SUMMARY OF THE INVENTION

According to a first aspect of the invention, there is provide a semiconductor imaging device comprising: a pixel area in which photoelectric conversion elements are arranged; a circuit area arranged around the pixel area; an interconnect including copper arranged in the pixel area and circuit area; and a cap layer arranged on the interconnect, wherein the cap layer except a part on the interconnect is removed from the pixel area and circuit area.

According to a second aspect of the invention, there is provide a semiconductor device manufacturing method comprising: forming photoelectric conversion elements in a pixel area and a circuit area of a semiconductor substrate, the circuit area arranged around the pixel area; forming a first insulation film on the pixel area and circuit area; forming an interconnect including copper on the first insulation film corresponding to the pixel area and circuit area; and forming a cap layer on the interconnect, the cap layer except a part on the interconnect removed from the pixel area and circuit area.

DETAILED DESCRIPTION OF THE INVENTION

An embodiment of the invention will be explained hereinafter with reference to the accompanying drawings.

Figure 1:
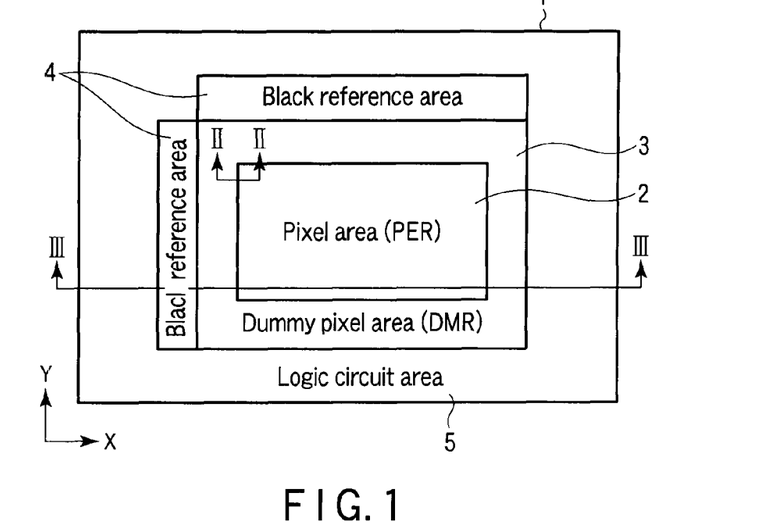
FIG. 1 is a plan view of an embodiment of a semiconductor imaging device according to the invention.

FIG. 1 shows an example of a semiconductor imaging device, to which the embodiment is applied. In a semiconductor imaging device 1, pixels are arranged in rows and columns in matrix in a pixel area (PER) 2. The pixels consist of photodiodes and transistors as photoelectric conversion elements, for example. The pixel area 2 is surrounded by a dummy pixel area (DMR) 3. The dummy pixel area 3 has the same configuration as the pixel area 2. A black reference area 4 is provided corresponding to the rows and columns in the dummy pixel area 3. The black reference area 4 consists of light-shielded photodiodes and transistors, for example, and generates a black reference signal. The photodiodes and transistors are the same as those in the pixel area 2. The black reference area 4 and dummy pixel area 3 are surrounded by a logic circuit area 5 comprising an analog signal circuit and a digital signal circuit.

Figure 2:
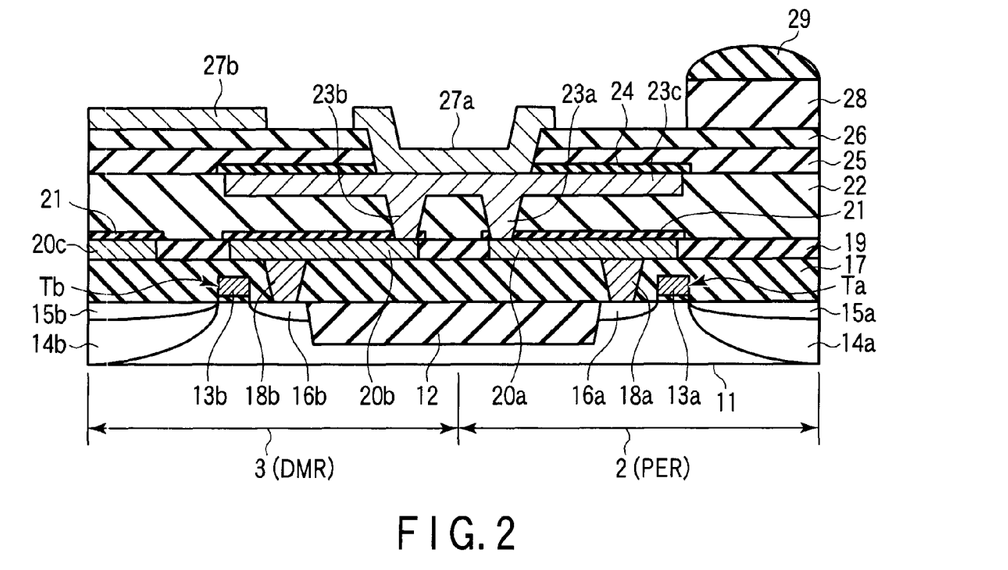
FIG. 2 is a sectional view taken along line II-II in FIG. 1.

FIG. 2 shows a cross section taken along line II-II in FIG. 1.

An element separation area 12 on a silicon substrate 11 as a semiconductor substrate separates the surface area of the substrate 11 into a pixel area (PER) 2 and a dummy pixel area (DPR) 3. On the substrate 11 of the pixel area 2 and dummy pixel area 3, gate electrodes 13a and 13b of transfer transistors Ta and Tb are formed on a gate insulation film. N-type photodiode areas 14a/14b and P-type photodiode areas 15a/15b are formed as photoelectric conversion elements on the substrate 11 corresponding to one side surface of the gate electrodes 13a and 13b, and diffusion layers 16a and 16b are formed as drain areas on the substrate 11 corresponding to the other side surfaces of the gate electrodes 13a and 13b.

On the substrate 11, a first interlayer insulation film 17 covering the gate electrodes 13a and 13b, and a second interlayer insulation film 19, are formed. In the first interlayer insulation film 17, contacts 18a and 18b connected to the diffusion layer 16 are formed. In the second interlayer insulation film 19, first Cu (copper) interconnects 20a, 20b and 20c are formed. The first Cu interconnects 20a and 20b are connected to the contacts 18a and 18b. On the first Cu interconnects 20a, 20b and 20c, a first cap layer 21 composed of a silicon nitride film, for example, is formed. The first cap layer 21 prevents diffusion of copper. The light transmissivity of the first cap layer 21 is low, the area located on the N- and P-type photodiodes 14a and 15a in the pixel area 2 is removed. The first cap layer 21 prevents transmission of hydrogen in an annealing process described later. Therefore, the first cap layer 21 except the area on the first Cu interconnect is removed.

A third interlayer insulation film 22 is formed on the first cap layer 21 and second interlayer insulation film 19. Contacts 23a and 23b are formed in the third interlayer insulation film 22 and first cap layer 19, and a second Cu interconnect 23c is formed in the third interlayer insulation film 22. The contacts 23a and 23b are connected to the first Cu interconnects 20a and 20b, respectively, and is connected to the second Cu interconnect 23c. A second cap layer 24 is formed on the second Cu interconnect 23c. The second cap layer 24 is removed except the upper part of the pixel area 2, dummy pixel area 3, black reference area 4, and the area on the second Cu interconnect in the logic circuit area 5.

A silicon oxide film 25 is formed as a passivation film on the second cap layer 24 and third interlayer insulation film 22. A silicon nitride film 26 is formed as a passivation film on the silicon oxide film 25. A bonding pad 27a consisting of aluminum, for example, is formed in the silicon nitride film 26, silicon oxide film 25, and second cap layer 24. The bonding pad 27a is connected to the second Cu interconnect 23c.

In the pixel area 2, a color filter 28 is formed on the silicon nitride film 26 corresponding to the photodiodes 14a and 15a. A micro lens 29 is formed on the color filter 28. A light-shielding film 27b consisting of aluminum, for example, is formed on the silicon nitride film 26 corresponding to the dummy pixel area 3, black reference area 4, and logic circuit area 5. The light-shielding film 27b shields the dummy pixel area 3, black reference area 4, and logic circuit area 5.

Next, an explanation will be given of a method of manufacturing the semiconductor imaging device configured as described above with reference to FIGS. 3 to 7. In FIGS. 3 to 7, the same parts as those in FIG. 2 are denoted by the same reference numbers.

Figure 3:
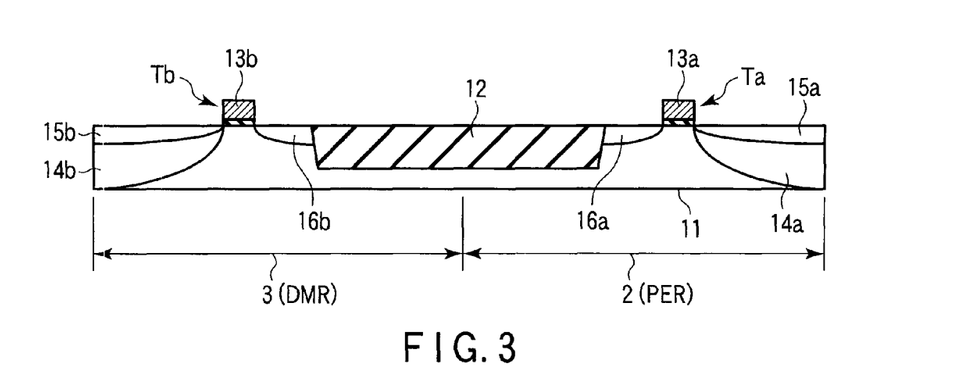
FIG. 3 is a sectional view showing a method of manufacturing the semiconductor imaging device shown in FIG. 2.

As shown in FIG. 3, an element separation area 12 composed of a silicon oxide film is formed in the P-type silicon substrate 11. Then, a silicon oxide film and a polysilicon layer are formed on the substrate 11 as a gate insulation film. The polysilicon layer and silicon oxide film are etched, and the gate electrodes 13a and 13b of the transfer transistors Ta and Tb are formed. N- and P-type impurities are ion-implanted through the gate electrodes 13a and 13b and not-shown resist pattern as a mask, and N-type photodiodes 14a and 14b, P-type photodiodes 15a and 15b, and N-type diffusion layers 16a and 16b are formed.

Figure 4:
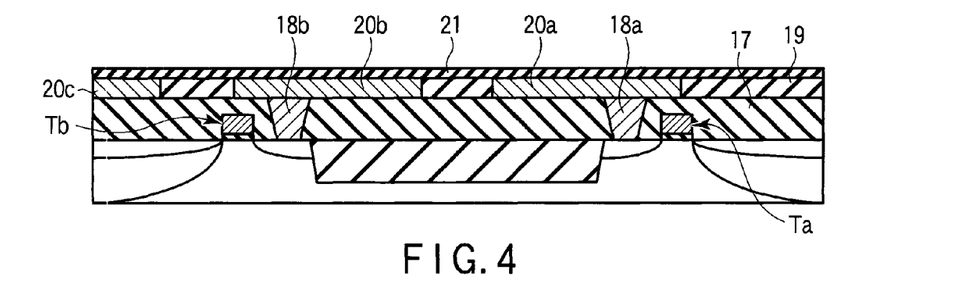
FIG. 4 is a sectional view showing a manufacturing process continued from FIG. 3.

Thereafter, as shown in FIG. 4, a silicon oxide film is deposited on the substrate 11 by chemical vapor deposition (CVD), for example. The silicon oxide film is flattened by chemical mechanical polishing (CMP), and a first interlayer insulation film 17 is formed. A first contact hole to expose the diffusion layers 16a and 16b is formed by photolithography on the first interlayer insulation film 17. Tungsten is embedded in the first contact hole, and the contacts 18a and 18b are formed.

Then, the second interlayer insulation film 19 composed of a silicon oxide film is deposited on the whole surface of the substrate 11. A first interconnect groove to expose the contacts 18a and 18b, and other interconnect grooves, are formed by photolithography on the second interlayer insulation film 19. Then, a Cu film is deposited on the whole surface. The Cu film is flattened by chemical mechanical polishing, and first Cu interconnects 20a, 20b and 20c are formed in the first interconnect groove. Then, to prevent oxidation and diffusion of the first Cu interconnects 20a, 20b and 20c, a silicon nitride film is deposited on the whole surface of the first Cu interconnects 20a, 20b and 20c and second interlayer insulation film 19, and the cap layer 21 is formed.

Figure 5:
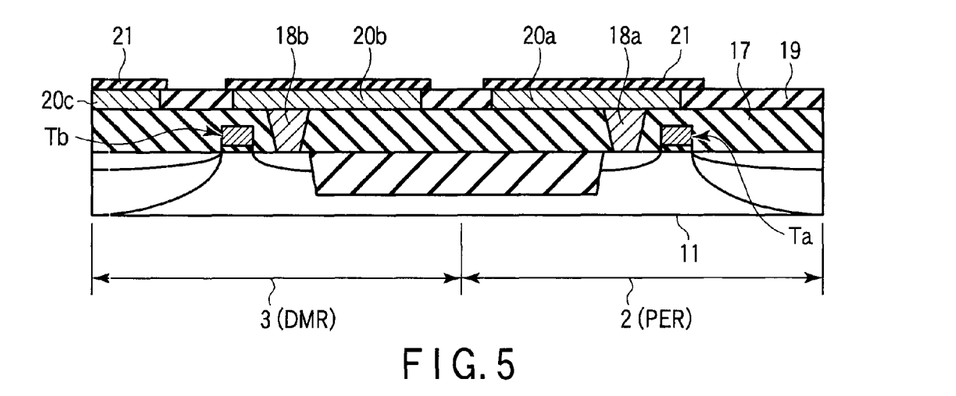
FIG. 5 is a sectional view showing a manufacturing process continued from FIG. 4.

Next, as shown in FIG. 5, the cap layer 21 on the optical path of the pixel area 2 is removed by photolithography to prevent a reduction in light transmissivity. At this time, the cap layer 21 except the parts on the first Cu interconnects 20b and 20c in the dummy pixel area 3, the cap layer except the parts on the first Cu interconnect in a not-shown black reference area and logic circuit area, are removed. In other words, in the dummy pixel area 3, black reference area, and logic circuit area, most of the cap layer 21 except the part on the first Cu interconnect is removed.

Figure 6:
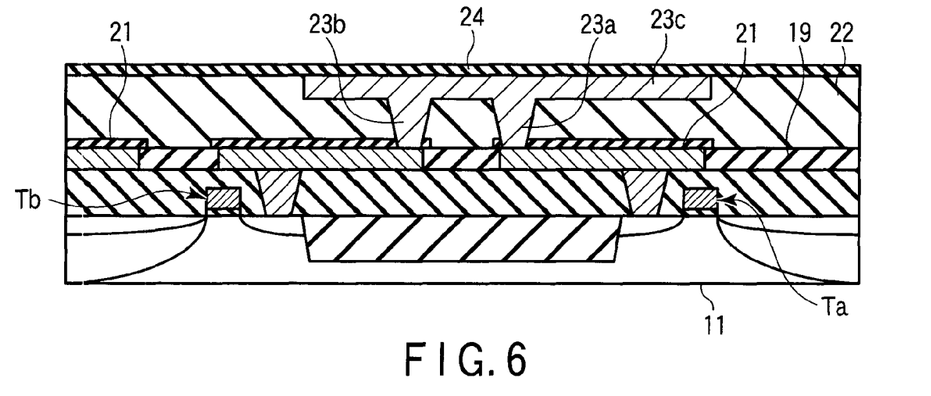
FIG. 6 is a sectional view showing a manufacturing process continued from FIG. 5.

Next, as shown in FIG. 6, the third interlayer insulation film 22 composed of a silicon oxide film is deposited on the whole surface, and the cap layer 21 and second interlayer insulation film 19 are covered. Thereafter, a second contact hole to expose the first Cu interconnects 20a and 20b, and a second interconnect groove communicating with the second contact hole, are formed by photolithography on the third interlayer insulation film 22 and cap layer 21. Subsequently, a second Cu film is deposited on the whole surface, and flattened by chemical mechanical polishing. In this dual damascene process, the second contacts 23a and 23b and second Cu interconnect 23c are formed. Then, a silicon nitride film is deposited on the whole surface to prevent oxidation and diffusion of the second Cu interconnect 23c, and the cap layer 24 is formed.

Figure 7:
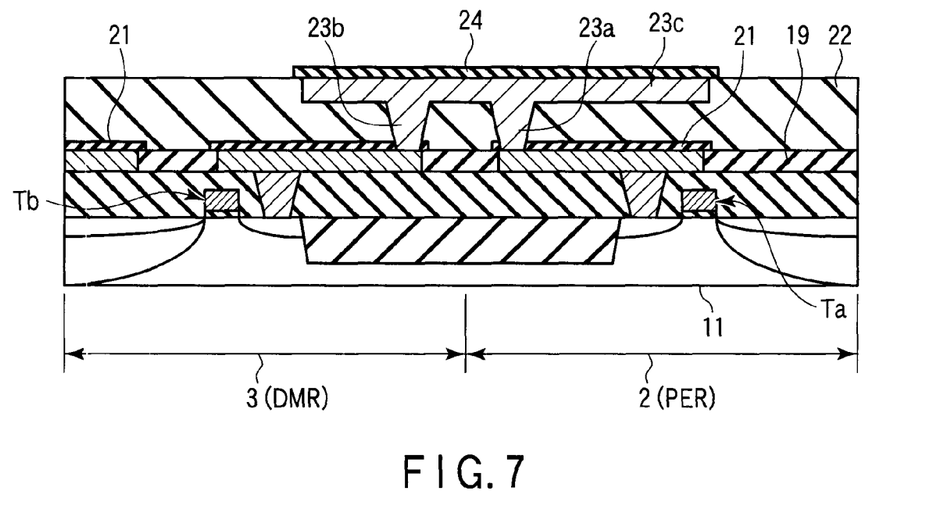
FIG. 7 is a sectional view showing a manufacturing process continued from FIG. 6.

Next, as shown in FIG. 7, the cap layer 24 on the optical path in the pixel area 2 is removed by photolithography to prevent a reduction in light transmissivity. At this time, the cap layer 24, except a part on the second Cu interconnect, is removed from the dummy pixel area 3, not-shown black reference area, and logic circuit area.

Next, as shown in FIG. 2, the passivation film 25 composed of a silicon oxide film and passivation film 26 composed of a silicon nitride film are sequentially deposited. Then, the substrate 11 is sintered as heat treatment at a temperature of approximately 400° C. in hydrogen gas atmosphere. In this process, hydrogen contained in the silicon nitride film is diffused into the silicon substrate, and the dangling bond at the boundary between silicon and gate oxide film is terminated by hydrogen.

Thereafter, the passivation films 26 and 25 and cap layer 21 are etched by photolithography, and an opening to expose the second Cu interconnect 23c is formed. Then, an aluminum layer is deposited, and an aluminum layer is patterned by photolithography. As a result, a bonding pad 27a is formed in the opening, and a light-shielding film 27b is formed on the dummy pixel area 3, black reference area, and logic circuit area. Then, a color filter 28 and a micro lens 29 are formed on the passivation film 26 corresponding to the optical path in the pixel area 2, and a CMOS image sensor is completed as a semiconductor imaging device. The color filter comprises R, G, Gr, and Gb, for example.

According to the above embodiment, in the pixel area 2, the cap layers 21 and 24 composed of a silicon nitride film on the optical path are removed. Further, the cap layers 21 and 24 except the parts on the second Cu interconnects 20b, 20c and 23c are removed from the dummy pixel area 3, black reference area, and logic circuit area. Therefore, the amount of hydrogen coming into a substrate can be equalized in the pixel area 2, dummy pixel area 3, black reference area, and logic circuit area. The dangling bond in the pixel area 2, dummy pixel area 3, black reference area, and logic circuit area can be securely terminated by hydrogen, and a transistor leakage current can be prevented. A difference in the output characteristic at a dark period can be prevented in the pixel area 2, dummy pixel area 3, black reference area, and logic circuit area.

Figure 8:
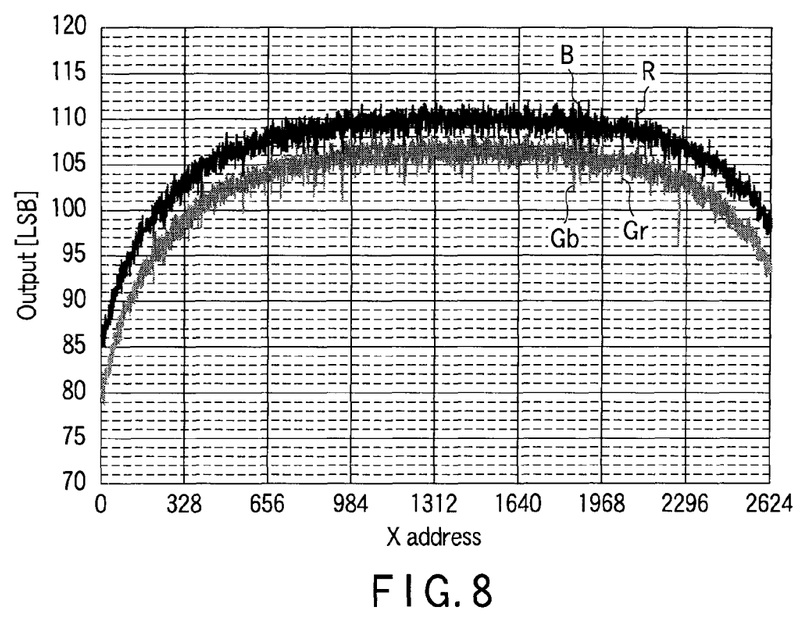
FIG. 8 is a graph showing output characteristics at a dark period of a conventional semiconductor imaging device.
Figure 9:
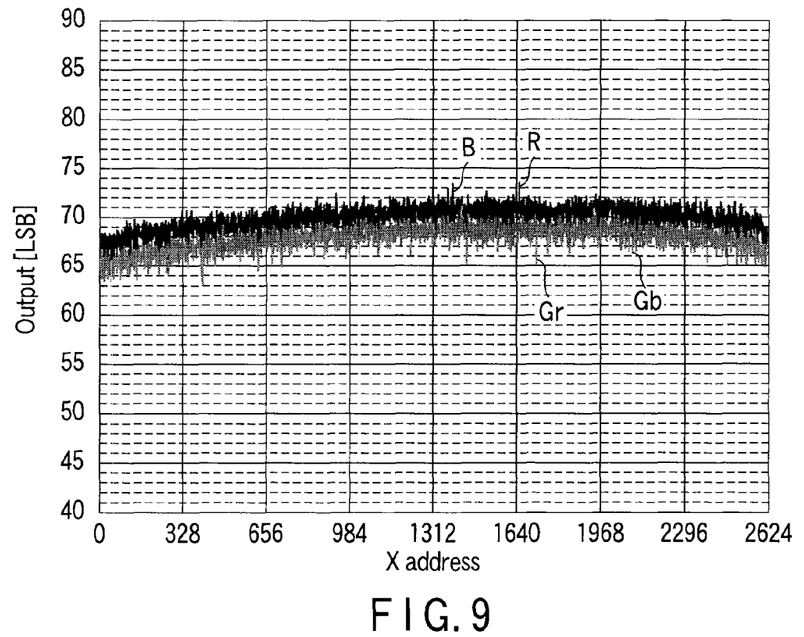
FIG. 9 is a graph showing output characteristics at a dark period of a semiconductor imaging device according to the embodiment.
Figure 11:
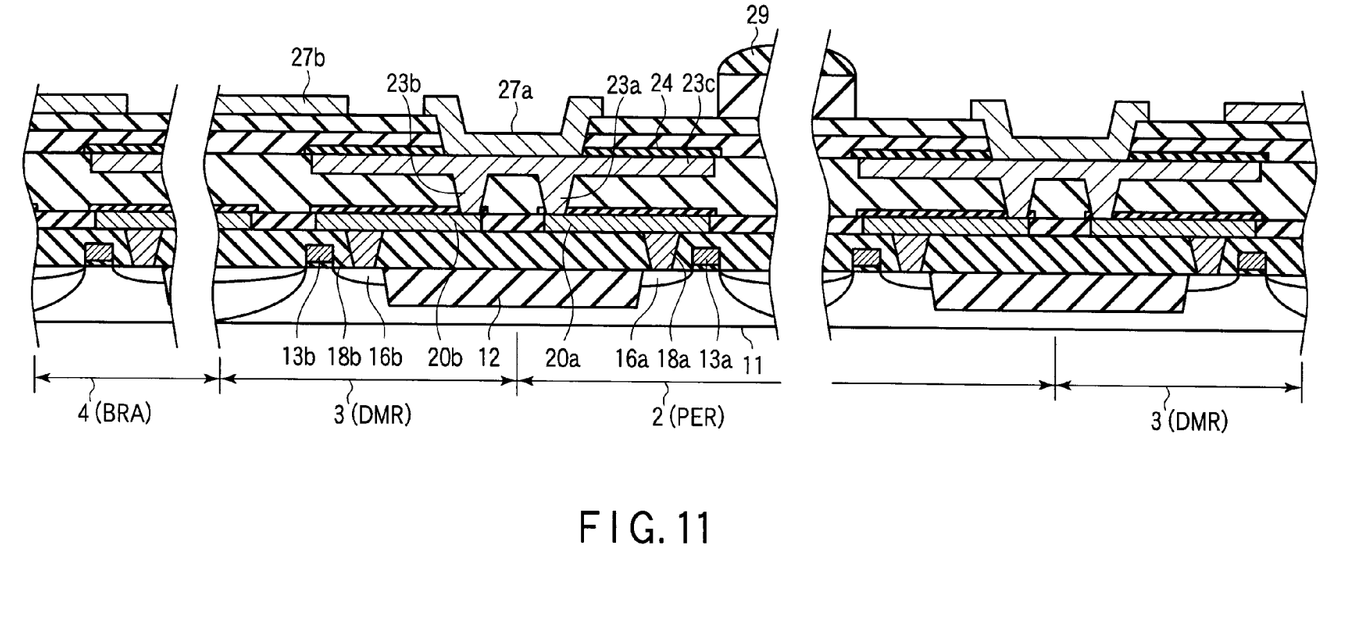
FIG. 11 is a sectional view taken along line III-III in FIG. 1.

FIGS. 8 and 9 show the output level (R, G, Gr, Gb) of a pixel at a dark period taken along line III-III (X address) in FIG. 1. FIG. 8 shows the output level in a conventional example, and FIG. 9 shows the output level in the embodied example. In FIGS. 8 and 9, from X address "0" to "2624" is a pixel area, and left side of the X address "0" is a dummy pixel area and a black reference area. An output level of X address "0" is an output level of the black reference area. Since no signal is output from the dummy pixel area, the dummy pixel area is not illustrated in FIGS. 8 and 9. FIG. 11 shows example of a sectional view taken along line III-III in FIG. 1.

The output level at a dark period is ideally constant along the X address. However, in the conventional example shown in FIG. 8, as a leakage current occurs in the dummy pixel area and black reference area, a difference of about 25 LSB occurs between the output levels from these areas and the output level from the pixel area. Specifically, in the black reference area in which X address is "0", an output level of Gr/Gb is 80 LSB and B/R is 85 LSB. On the other hand, in the center of the pixel area in which. X address is "1312", an output level of Gr/Gb is 105 LSB and B/R is 110 LSB. For this reason, the difference of the output level of these areas is about 25 LSB.

In the embodied example shown in FIG. 9, a leakage current is prevented in the dummy pixel area, black reference area, and logic circuit area. Therefore, a difference between the output levels from these areas and the output level from the pixel area is reduced to about 5 LSB.

Further, in the above embodiment, the cap layers 21 and 24 composed of a silicon nitride film are formed on the first and second Cu interconnects 20a, 20b and 20c, and the first Cu interconnect 23c. Therefore, diffusion and oxidation of Cu can be prevented.

Figure 10:
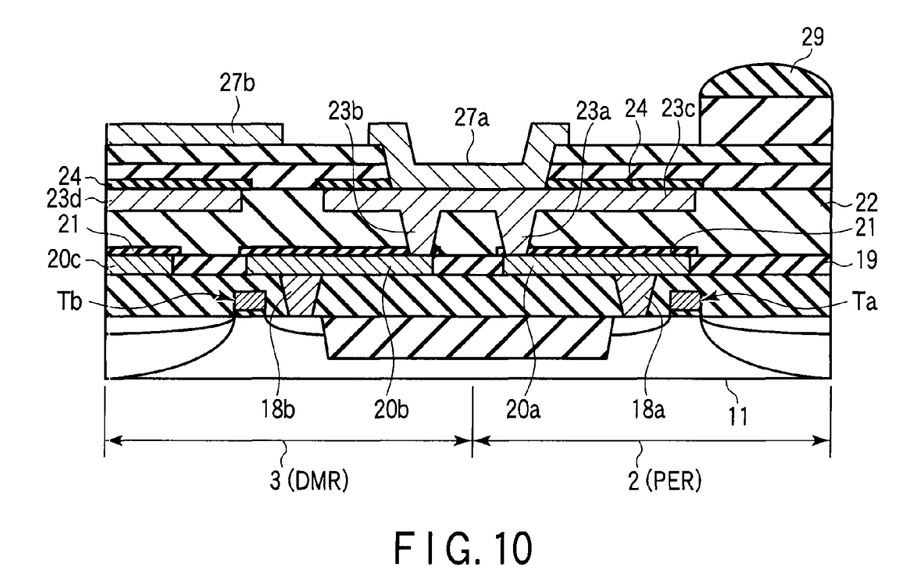
FIG. 10 is a sectional view of a modification of the invention.

FIG. 10 shows a modification of the invention.

In the embodiment shown in FIG. 2, in the dummy pixel area 3, the area having no first Cu interconnect and the area having no second Cu interconnect 23c between the first Cu interconnects 20b and 20c are present at substantially the same vertical position.

In contrast, in the modification shown in FIG. 10, the area having no first Cu interconnect between the first Cu interconnects 20b and 20c, and the area having no second Cu interconnect 23c between the second Cu interconnects 23c and 23d, are not present at substantially the same vertical position in the dummy pixel area 3. Further, the cap layers 21 and 24 composed of a low transmissive silicon nitride film are formed on the first and second Cu interconnects 20b, 20c, 23c and 23d. Therefore, the light-shielding performance can be improved in the modification.

Further, in the above embodiment, the invention is applied to a CMOS image sensor. The invention may be applied to the other sensors and semiconductor devices using a Cu interconnect.

The first and second interconnects are not limited to Cu interconnects. Interconnects including Copper may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor imaging device comprising:
a pixel area in which photoelectric conversion elements are arranged;
a circuit area arranged around the pixel area;
an interconnect including copper arranged in the pixel area and circuit area; and
a cap layer, arranged on the interconnect, being an insulating layer including nitrogen,
wherein the cap layer except a part on the interconnect is removed from the pixel area and circuit area.

2. The device according to claim 1, wherein the cap layer is composed of a silicon nitride film.

3. The device according to claim 1, wherein the cap layer is formed only on an interconnect including copper.

4. The device according to claim 1, wherein dark period characteristics of the pixel area and circuit area are substantially the same.

5. The device according to claim 1, wherein the circuit area comprises a dummy pixel area, a black reference area, and a logic circuit area.

6. The device according to claim 1, wherein the circuit area comprises a photoelectric conversion element; the interconnect in the circuit area comprises first and second interconnects formed on a first insulation film on the photoelectric conversion element, and third and fourth interconnects formed on a second insulation film on the first and second interconnects; and a first area between the first and second interconnects is formed at a position different from a second area between the third and fourth copper interconnects,
wherein the first to fourth interconnects include Copper.

7. A semiconductor device manufacturing method comprising:
forming photoelectric conversion elements in a pixel area and a circuit area of a semiconductor substrate, the circuit area arranged around the pixel area;
forming a first insulation film on the pixel area and circuit area;
forming an interconnect including copper on the first insulation film corresponding to the pixel area and circuit area; and
forming a cap layer being an insulating layer including nitrogen on the interconnect, the cap layer except a part on the interconnect removed from the pixel area and circuit area.

8. The method according to claim 7, wherein the interconnect is formed in the pixel area and circuit area except the photoelectric conversion elements.

9. The method according to claim 7, wherein the cap layer is composed of a silicon nitride film.

10. The method according to claim 7, wherein the cap layer is formed only on the interconnect.

11. The method according to claim 10, further comprising heat treating the semiconductor substrate using hydrogen gas.

12. The method according to claim 7, wherein the dark period characteristics of the pixel area and circuit area are substantially the same.

13. The method according to claim 7, wherein the circuit area comprises a dummy pixel area, a black reference area, and a logic circuit area.

14. The method according to claim 7, wherein the circuit area comprises a photoelectric conversion element; the interconnect in the circuit area comprises first and second interconnects formed on a first insulation film on the photoelectric conversion element, and third and fourth interconnects formed on a second insulation film on the first and second interconnects; and a first area between the first and second interconnects is formed at a position different from a second area between the third and fourth interconnects, wherein the first to fourth interconnects include Copper.

\* \* \* \* \*